United States Patent [19]

Lindstrom

[11] Patent Number: 5,600,128

[45] Date of Patent: Feb. 4, 1997

[54] INFRARED RECEIVER WITH VARIABLE INPUT RESISTANCE FOR OPTICAL COMMUNICATION SYSTEMS

[75] Inventor: Kirk W. Lindstrom, Los Altos, Calif.

[73] Assignee: Hewlett-Packard Company, Palo Alto, Calif.

[21] Appl. No.: 426,745

[22] Filed: Apr. 20, 1995

[51] Int. Cl.$^6$ .............................. H01J 40/14; G01N 21/00
[52] U.S. Cl. ............................... 250/214 AG; 250/214 A; 359/194; 330/59
[58] Field of Search .......................... 250/214 AG, 551, 250/206, 214 C, 214 R, 214 A; 356/224; 327/512; 359/194, 189; 330/59, 278

[56] References Cited

U.S. PATENT DOCUMENTS

| | | | |
|---|---|---|---|
| 1,692,904 | 11/1928 | Potter | 250/214 R |
| 2,145,147 | 1/1939 | Wolferz | 356/224 |
| 3,218,917 | 11/1965 | Foersterling et al. | 356/224 |
| 3,999,060 | 12/1976 | Skagerlund | 356/224 |
| 4,673,807 | 6/1987 | Kobayashi et al. | 250/214 AG |
| 4,798,950 | 1/1989 | Hosoda et al. | 356/224 |
| 5,138,149 | 8/1992 | Cadet et al. | 250/214 AG |

*Primary Examiner*—Edward P. Westin
*Assistant Examiner*—John R. Lee
*Attorney, Agent, or Firm*—John L. Imperato

[57] ABSTRACT

A large dynamic range infrared receiver with a variable input resistance for use in optical communication systems is described. The variable resistance provides this infrared receiver with three ranges of sensitivity depending on the power of the optical signal incident on the receiver. At low optical power, the variable resistance is high, providing the infrared receiver with high sensitivity. For intermediate optical power the variable resistance is reduced, providing the infrared receiver with medium sensitivity. At high optical power levels, the variable resistance switches to a low value, reducing the infrared receiver's sensitivity and limiting the voltage across the variable resistance.

7 Claims, 4 Drawing Sheets

INFRARED RECEIVER WITH VARIABLE INPUT RESISTANCE FOR OPTICAL COMMUNICATION SYSTEMS

BACKGROUND SUMMARY OF THE INVENTION

Optical communication systems provide wireless data links between computers, disk drives, printers and other devices. Reliable optical communication is critical in applications such as banking or computer assisted flight control, where any data loss may have disastrous consequences. An infrared receiver within the optical communication system converts light signals containing encoded data into electronic waveforms, recovering the encoded data. The ratio of the strongest light signal that the infrared receiver can detect without overloading to the weakest light signal that it can detect is the receiver's dynamic range.

Known infrared receivers using a fixed load resistor have small dynamic ranges. This type of infrared receiver can be optimized to detect weak light signals but is then overloaded by strong light signals. Conversely, the infrared receiver can be designed to handle strong light signals without overloading, but it will not then be sensitive enough to detect weak light signals. A second known infrared receiver uses a clamping diode to prevent the infrared receiver from overloading, but it also has a small dynamic range. Although this second infrared receiver can detect weak light signals, strong light signals are truncated by the clamping diode and the data encoded in the strong light signal may be lost.

In accordance with a preferred embodiment of the present invention, an infrared receiver having a large dynamic range is constructed using a variable input resistance. The variable input resistance changes according to the strength of the light signal. In the presence of weak light signals, the variable input resistance is high, enabling the infrared receiver to detect the weak signals. In the presence of strong light signals, the variable resistance is low, preventing the infrared receiver from overloading. This infrared receiver has a large dynamic range and successfully recovers encoded data from both weak and strong light signals, improving the reliability of the data link in optical communication systems.

DETAILED DESCRIPTION OF THE PREFERRED EMBODIMENT

Figure 1:
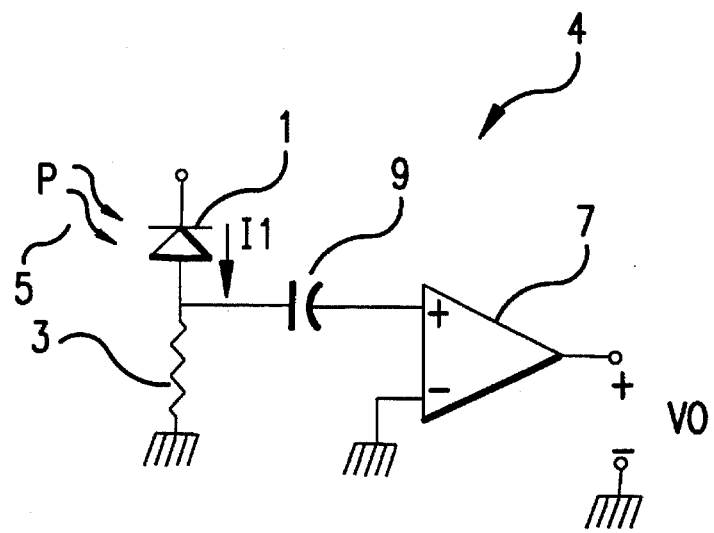
FIG. 1 shows a known infrared receiver having a fixed load resistor.

FIG. 1 shows a known infrared receiver 4 with a diode detector 1 connected to fixed load resistor 3 and amplifier 7 through capacitor 9. Light signal 5 containing encoded data is incident on diode detector 1, producing a detector current $I_1$ that is proportional to the optical power P of light signal 5. An output voltage $V_O$ is produced by amplifier 7 in response to optical power P. For infrared receiver 4 to detect low optical power P the resistance of load resistor 3 should be large. However, if high optical power P is present, amplifier 7 saturates, overloading infrared receiver 4.

Figure 2:
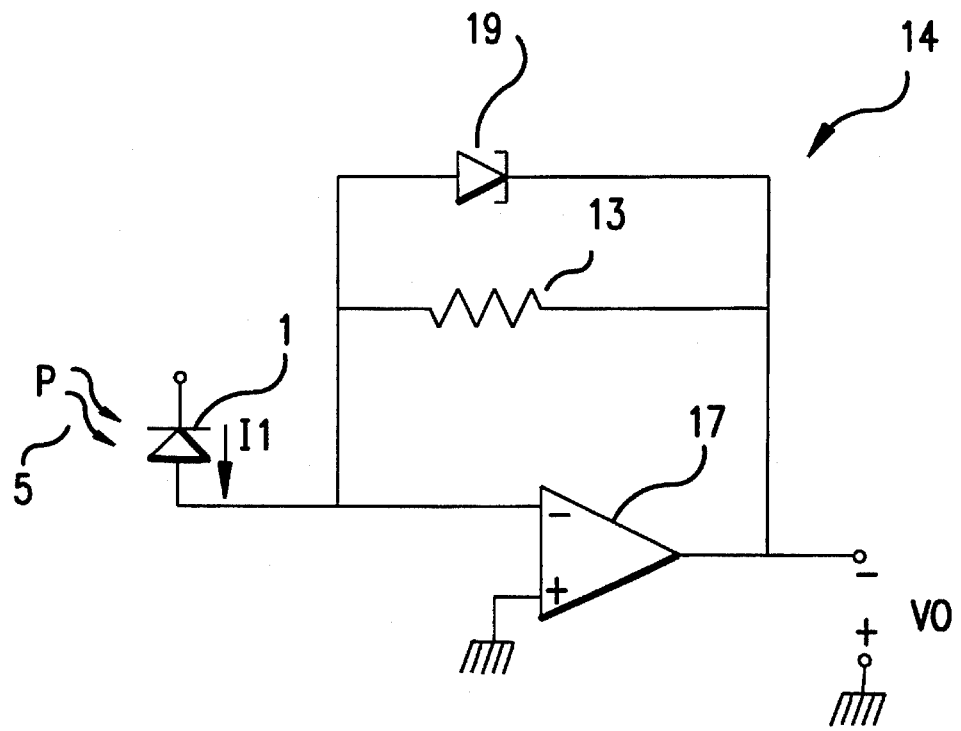
FIG. 2 shows a known infrared receiver having a clamping diode.

FIG. 2 shows a second known infrared receiver 14 that couples an amplifier 17 with clamping diode 19 and feedback resistor 13 to prevent infrared receiver 14 from overloading in response to high optical power P. When light signal 5 containing encoded data is incident on a diode detector 1 the diode detector generates a current $I_1$, proportional to the optical power P, that flows through the parallel combination of feedback resistor 13 and clamping diode 19. The feedback resistor can be large so that low optical power P can be detected. For high optical power P, clamping diode 19 conducts, preventing amplifier 17 from saturating by shunting detector current $I_1$ through the low resistance path of clamping diode 19. However, data encoded in light signals 5 having high optical power P is not recoverable because clamping diode 19 truncates the output voltage $V_O$ of amplifier 17.

Figure 3:
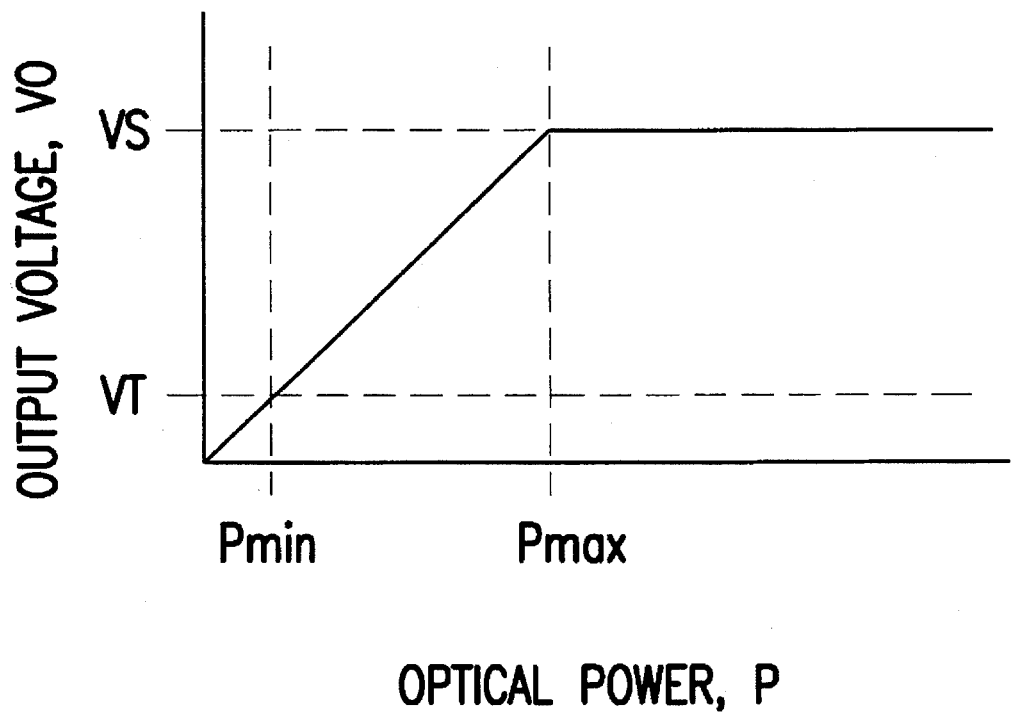
FIG. 3 shows the relationship between the optical power of the light signal input and the output voltage of the known infrared receivers shown in FIG. 1 and FIG. 2.

FIG. 3 illustrates the relationship between the optical power P of light signal 5 and the output voltage $V_O$ of the known infrared receivers 4 and 14 shown in FIG. 1 and FIG. 2, respectively. A threshold voltage $V_T$ is the minimum output voltage $V_O$ necessary to recover data that had been encoded in the light signal 5. A minimum power $P_{min}$ is the optical power P that corresponds to the threshold voltage $V_T$. The value of output voltage $V_O$ equals saturation voltage $V_S$ when the optical power P exceeds a maximum power $P_{max}$. The output voltage $V_O$ does not change for optical powers P that are equal to or greater than the maximum signal, $P_{max}$ which results in the data encoded in these high power light signals 5 to be lost.

The dynamic range, defined to be the ratio $P_{max}/P_{min}$, can be calculated from the graph of FIG. 3. Due to the linear relationship between output voltage $V_O$ and optical power P for values of optical power P between $P_{min}$ and $P_{max}$, it follows that the dynamic range $P_{max}/P_{min}$ is equal to $V_S/V_T$. For typical values for the saturation voltage $V_S$ and threshold voltage $V_T$ equal to 0.7 volts and 0.005 volts, respectively, the dynamic range is 0.7/0.005 or 140.

Figure 4:
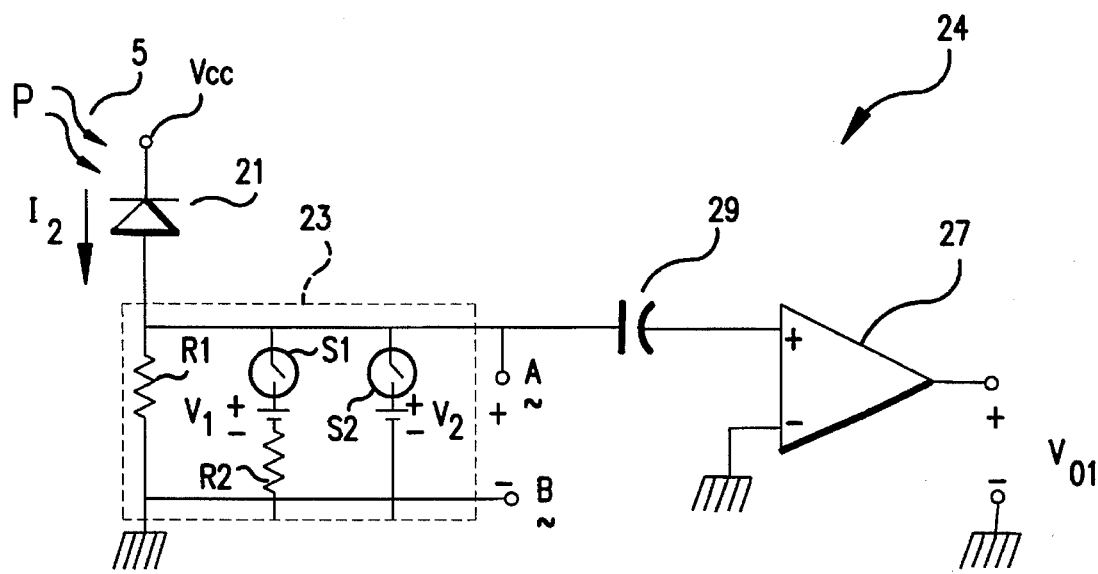
FIG. 4 is a block diagram of a first preferred embodiment of the present invention.

FIG. 4 is a block diagram of large dynamic range infrared receiver 24 using variable resistance 23 constructed according to a preferred embodiment of the present invention. Detector 21, connected to voltage supply $V_{cc}$, generates a detector current $I_2$ proportional to the optical power P incident on the detector 21. The detector current $I_2$ flows through variable resistance 23 to produce a detected voltage $V_I$ between terminals A and B. The incremental change in detected voltage $V_I$ versus the change in optical power P is the sensitivity of infrared receiver 24.

Switches S1 and S2 are voltage controlled switches which provide infrared receiver 24 with three sensitivity ranges depending on the applied optical power P of light signal 5. For low optical power P, switches S 1 and S2 are open and detector current $I_2$ flows only through resistor R1. Resistor R1 is large, giving infrared receiver 24 high sensitivity. For intermediate optical power P, detected voltage $V_I$ is greater than or equal to a voltage $V_1$ and less than voltage $V_2$, which causes switch S1 to close. Detector current $I_2$ then flows through both resistor R2 and resistor R1. The parallel combination of resistors R1 and R2 reduces the sensitivity of the infrared receiver to light signals 5 having intermediate optical power P. For excessive optical power P, the detector current $I_2$ produces a detected voltage $V_I$ equal to a voltage $V_2$, which causes switches S1 and S2 to close. As voltage source $V_2$ has very low internal resistance in comparison to the parallel combination of R1 and R2, detected voltage $V_I$ would be limited to the voltage $V_2$, further reducing the sensitivity of infrared receiver 24.

Terminals A and B may be connected through capacitor 29 to an amplifier 27 (shown in schematic form) or a comparator or other electronic circuit needed to further process the detected voltage $V_I$. Closing switches S1 and S2 reduces the sensitivity of infrared receiver 24 in the presence of intermediate and excessive optical power P, which controls the range of detected voltage $V_I$, preventing amplifier 27 from saturating and overloading infrared receiver 24.

Figure 5:
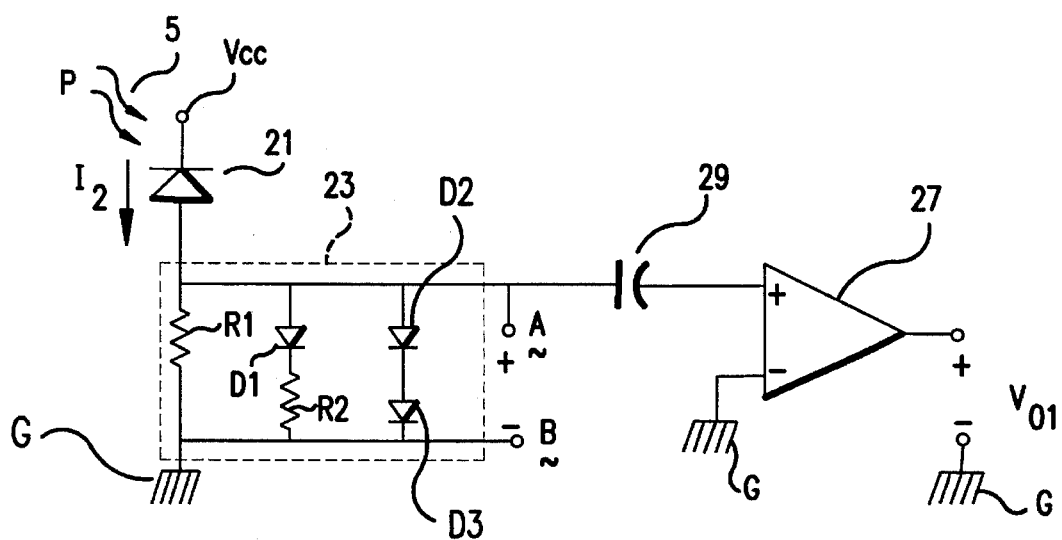
FIG. 5 is a schematic diagram of the first preferred embodiment of the present invention.

FIG. 5 is a schematic implementation of the large dynamic range infrared receiver 24, shown in FIG. 4. Diode D1 is used to implement the combined functions of voltage source $V_1$ and switch S1. Diodes D2 and D3 are used to implement the functions of switch S2 and voltage source $V_2$. Diodes D1, D2 and D3 function as switches that open and close depending on the detected voltage $V_I$ generated by detector current $I_2$ flowing through variable resistance 23. When the detected voltage $V_I$ is less than voltage $V_1$, the resistance of diodes D1, D2 and D3 is high, and each performs the function of an open switch. When the detected voltage $V_I$ is greater than or equal to voltage $V_1$, in this embodiment 0.7 volts, diode D1 conducts, acting as a closed switch to provide a low resistance connection between detector 21 and resistor R2. When the detected voltage $V_I$ equals voltage $V_2$, in this embodiment 1.4 volts, diodes D2 and D3 conduct, providing a low resistance path between detector 21 and a reference point G which may be connected to ground or another reference potential. The conduction of diodes D2 and D3 limits the input voltage $V_I$ to voltage $V_2$, preventing amplifier 27 from becoming saturated. As detected voltage $V_I$ is limited to voltage $V_2$, the output voltage $V_{O1}$ of amplifier 27 will also be limited to a fixed voltage.

Figure 6:
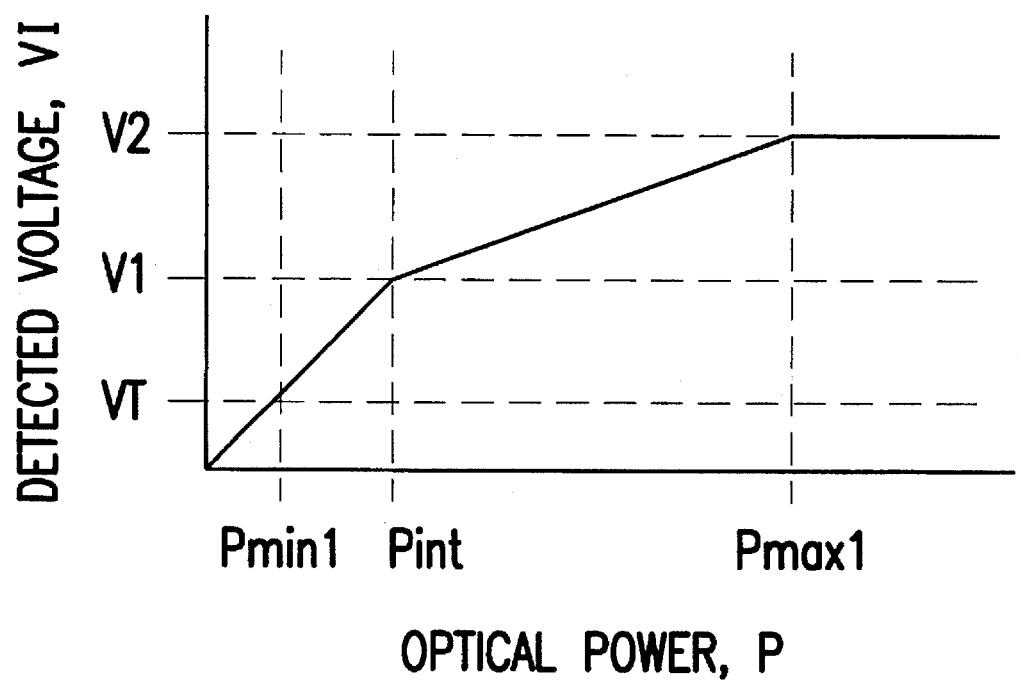
FIG. 6 shows the relationship between the optical power of the light signal input and the detected voltage of the first preferred embodiment of the present invention.

FIG. 6 shows the relationship between the optical power P and the detected voltage $V_I$ of the high dynamic range infrared receiver of FIGS. 4 and 5. Threshold voltage $V_T$ is the minimum detected voltage $V_I$ that is necessary to recover data that had been encoded in the light signal 5. An optical power $P_{min1}$ corresponds to the threshold voltage $V_T$. A voltage $V_1$ is the detected voltage $V_I$ produced by an optical power $P_{int}$. An optical power $P_{max1}$ is the optical power P that produces a detected voltage $V_I$ equal to $V_2$.

The dynamic range of the infrared receiver 24 constructed with variable resistance 23 is the ratio $P_{max1}/P_{min1}$. Since the optical power P is proportional to the detector current $I_2$, dynamic range equals $I_{max1}/I_{min1}$ where $I_{max1}$ is the detector current $I_2$ produced by optical power $P_{max1}$ and $I_{min1}$ is the detector current $I_2$ produced by optical power $P_{min1}$. For this example under conditions of $P_{max1}$, diodes D1, D2 and D3 are conducting and each have forward voltage drops equal to 0.7 volts. With resistor R1=2000 ohms and resistor R2=100 ohms, $I_{max1}$ equals:

$$I_{max1}=(1.4 \text{ volts})/2000 \text{ ohms}+(0.7 \text{ volts})/100 \text{ ohms}=7.7 \text{ milliamperes}.$$

Under conditions of $P_{min1}$, diodes D1, D2, D3 are not conducting and behave as open switches. Hence, $$I_{min1}=V_T/R1=(0.005 \text{ volts}/2000 \text{ ohms})=0.003 \text{ milliamperes},$$ using the value of $V_T$ equal to 0.005 volts for reasons of comparison to the known infrared receivers of FIGS. 1 and 2. In this example the dynamic range of infrared receiver 24 is equal to 7.7/0.003 or 3080 or twenty two times greater than the known infrared receivers shown in FIGS. 1 and 2.

What is claimed is:

1. A receiver for converting a light signal into an electrical signal, comprising:

a detector for receiving the light signal and producing a current, the current strength varying directly with the light signal strength;

a variable resistance with two terminals, one of the terminals coupled to the detector for receiving the current, the other of the terminals connected to a reference voltage, the variable resistance producing a variable voltage across the terminals in response to the varying current wherein the resistance of the variable resistance varies with the variable voltage; and an amplifier having a pair of inputs, each input coupled to a terminal of the variable resistance, the amplifier amplifying the variable voltage.

2. The receiver of claim 1 wherein the variable resistance has a first predefined resistance value when the voltage across the terminals is less than a first predefined voltage level and a second predefined resistance value less than the first predefined resistance value when the voltage across the terminals is between the first predefined voltage level and a second predefined voltage level greater than the first predefined voltage level.

3. The receiver of claim 2 wherein the variable resistance further comprises a voltage limiter for preventing the voltage across the terminals from exceeding a third predefined voltage level greater than the second predefined voltage level.

4. The receiver of claim 3 wherein the variable resistance further includes:

a first fixed resistance; and a voltage dependent resistance which couples in parallel to the fixed resistance when the voltage across the variable resistance exceeds the first predefined voltage level.

5. The receiver of claim 4 wherein the voltage dependent resistance further includes:

a second fixed resistance;

a first switch connected in series to the second fixed resistance, the first switch closing when the first predefined voltage level is exceeded, the first switch having a fixed voltage drop when closed.

6. The receiver of claim 4, wherein the first fixed resistance comprises a first resistor coupled between a first and second node, and the voltage dependent resistance comprises:

a first diode having an anode and a cathode, the anode coupled to the first node; and a second resistor coupled to the cathode of the first diode and the second node.

7. The receiver of claim 6, the voltage limiter comprising:

a second diode, having an anode and a cathode, the anode of the second diode coupled to the first node; and a third diode, having an anode and a cathode, the anode of the third diode coupled to the cathode of the second diode and the cathode of the third diode coupled to the second node.

* * * * *